United States Patent [19]

Cook

[11] Patent Number: 4,749,955
[45] Date of Patent: Jun. 7, 1988

[54] LOW VOLTAGE COMPARATOR CIRCUIT

[75] Inventor: Thomas D. Cook, Kokomo, Ind.

[73] Assignee: Delco Electronics Corporation, Kokomo, Ind.

[21] Appl. No.: 946,780

[22] Filed: Dec. 29, 1986

[51] Int. Cl.[4] ............................................. H03F 3/45
[52] U.S. Cl. ...................................... 330/253; 330/261
[58] Field of Search ............... 330/252, 253, 261, 277; 307/362, 355

[56] References Cited

U.S. PATENT DOCUMENTS 4,124,808 11/1978 Shiev et al. ........................ 307/362
4,511,810 4/1985 Yukawa ............................. 307/355

Primary Examiner—Gene Wan
Attorney, Agent, or Firm—Mark A. Navarre

[57] ABSTRACT

A low voltage comparator circuit including a differential amplifier circuit, a double-ended to single-ended conversion circuit, and an inverting amplifier circuit is disclosed. The differential amplifier circuit consists of two identical current paths, each having one upper and one lower MOSFET device connected together in series between supply voltage and ground. Each of two input voltages is applied directly to the gate of the upper MOSFET device in one current path and is also coupled, after being inverted, to the gate of the lower MOSFET device in the opposite current path, respectively.

1 Claim, 1 Drawing Sheet

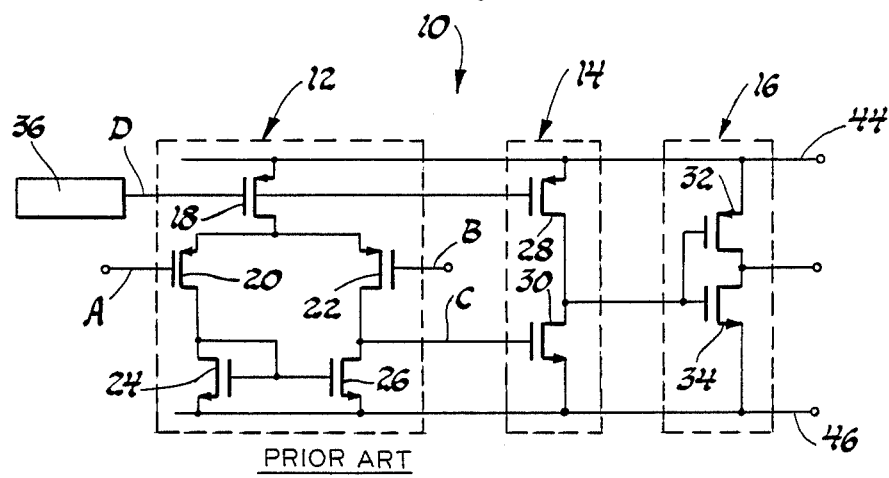
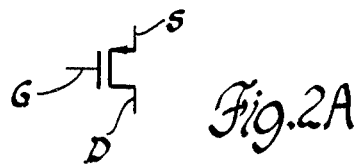
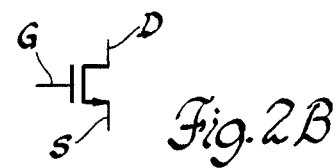
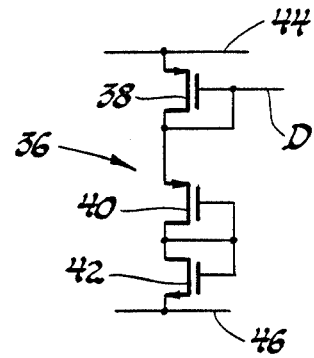
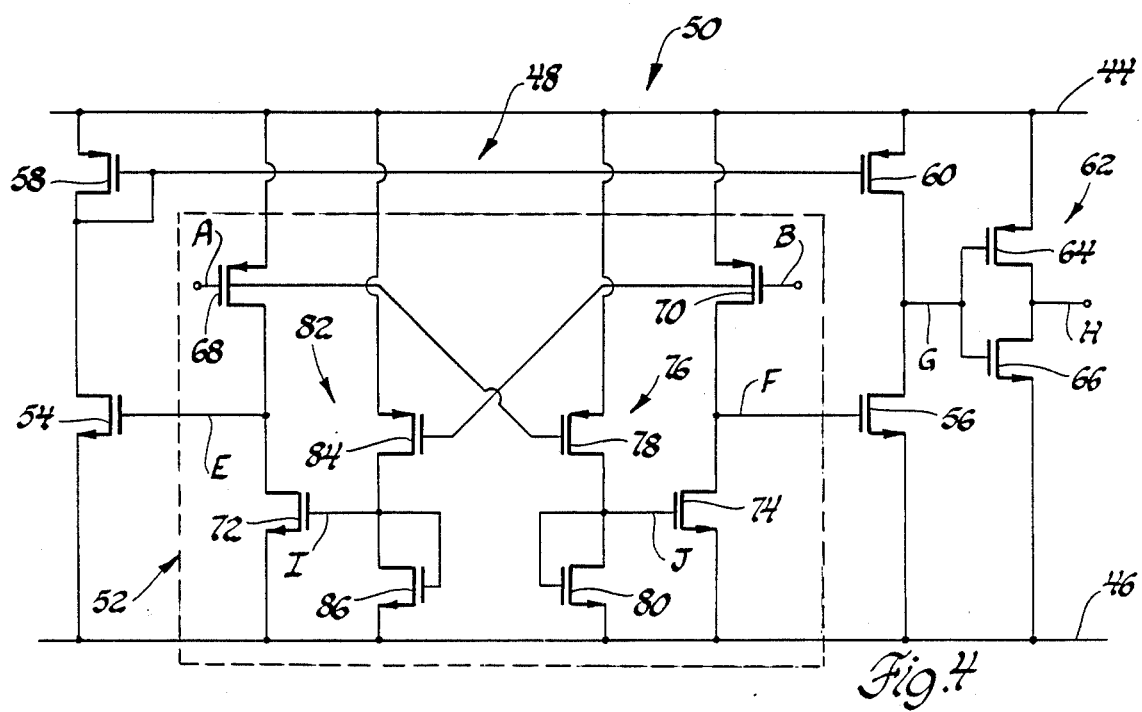

LOW VOLTAGE COMPARATOR CIRCUIT

This invention relates to a differential amplifier circuit for use as, for example, the differential stage in an integrated MOSFET comparator circuit.

BACKGROUND OF THE INVENTION

In a conventional differential amplifier circuit, current from a constant current source is divided between two current paths on the basis of two input voltages. Any current difference resulting thereby is reflected in voltages produced across equal loads located in the two current paths. For a differential amplifier circuit fabricated in a semiconductor integrated circuit, the constant current source is usually realized by one or more transistors and each current path consists of a differential input transistor and a load transistor connected in series. The load transistors are coupled together to form a current mirror load, thus yielding relatively high gain. High input impedance output amplifier stages are typically added to the differential amplifier in a practical circuit application, such as a voltage comparator.

A problem arises in the conventional differential amplifier circuit having a constant current source for applications where a low supply voltage is encountered. Specifically, the minimum supply voltage is limited to approximately the sum of the series-connected transistor threshold voltages, and the common mode input range is limited by the requirement that the transistor implementing the constant current remain in saturation. In automotive applications, for example, the upper limit of the common mode range for a conventional circuit is typically only slightly more than one half the supply voltage. Furthermore, circuits designed to operate from a low supply voltage exhibit poor speed performance due to increased capacitance accompanying the necessary increase in the size of the circuit devices. A further disadvantage of the requirement of a constant current source is increased overall power consumption and limitations on the current available to various circuit elements during circuit operation. It is desirable, therefore, to provide a low voltage, low power, high speed, precision differential amplifier circuit for which the common mode input range approaches the supply voltage.

SUMMARY OF THE INVENTION

Accordingly, in a differential amplifier circuit pursuant to the invention, two differential input transistors are connected directly to a supply voltage and each operates as a voltage controlled current source in response to a respective input voltage. The current from each transistor passes through a respective load transistor, establishing a respective current path.

In contrast to a conventional static load stage, i.e., a current mirror load, the load transistors according to the present invention comprise a gain stage in which each transistor is a voltage controlled active current driver. Specifically, the input voltage applied to the gate of the current source transistor of one current path is passed through an inverting amplifier and applied to the gate of the current load transistor in the opposite current path. In this configuration, a change in either input voltage is immediately reflected at both differential voltage outputs taken across the load transistors of each current path. In addition to allowing operation over a wider common mode input range at lower supply voltages, the differential amplifier circuit of the present invention provides additional gain and, therefore, increased speed.

BRIEF DESCRIPTION OF THE DRAWINGS

FIG. 1 is a schematic circuit diagram of a conventional voltage comparator circuit including a differential amplifier stage;

FIGS. 2a and 2b illustrate the symbols used for tranristors in the accompanying drawings;

FIG. 3 is a schematic circuit diagram of an exemplary bias voltage supply circuit; and FIG. 4 is a schematic circuit diagram of a voltage comparator incorporating a differential amplifier circuit in accordance with the principles of the present invention.

DESCRIPTION OF THE PREFERRED EMBODIMENT

Referring now to FIG. 1, there is shown a voltage comparator circuit 10 according to the prior art. The comparator circuit 10 includes a differential amplifier circuit 12 and inverting amplifier circuits 14 and 16. As shown in FIG. 1, the differential amplifier circuit 12 includes a P-channel field effect transistor (FET) 18 serving as a constant current source, two P-channel FETs 20 and 22 serving as differential input transistors, and two N-channel FETs 24 and 26 forming a current mirror type load circuit.

In the differential amplifier circuit 12, an output voltage proportional to a difference between input voltages applied to input terminals A and B is extracted from an output terminal C. The voltage at output terminal C is then amplified by the inverting amplifier 14 having a P-channel FET 28 serving as a constant current load and an N-channel FET 30. Further amplification is provided by the inverting amplifier 16 having a P-channel FET 32 and an N-channel FET 34.

The symbols used in the drawings to depict a P-channel transistor and an N-channel transistor are shown in FIGS. 2a and 2b, respectively. In both symbols, reference letter G denotes a gate, S a source, and D a drain.

A conventional bias voltage supplying circuit 36 that is adapted to operate FETs 18 and 28 in a constant current region is shown in FIG. 3. The bias voltage circuit 36 consists of two P-channel FETs 38 and 40, and an N-channel FET 42 connected in series between the supply voltage terminals 44 and 46. The respective gates of the FETs 38, 40, and 42 are connected to the respective FET drains. The bias voltage circuit 36 is adapted to divide the power source voltage applied between the terminals 44 and 46 to provide an output voltage at a terminal D for application to the gates of FETs 18 and 28 in FIG. 1.

The prior art differential amplifier circuit 12 of FIG. 1 has inherent disadvantages for low voltage applications. Because circuit 12 requires the FET 18 to provide a constant current, the common mode input applied to the terminals A and B cannot exceed the supply voltage at the terminal 44 minus the voltage across the FET 18 and the threshold voltage for the FETs 20 and 22. Also, the supply voltage across the terminals 44 and 46 is limited to at least three FET threshold voltages in order to ensure that the FET 18, the differential input pair of FETs 20 and 22, and the load FETs 24 and 26 operate in their respective saturation regions.

A further disadvantage of the prior art differential amplifier circuit 12, shown in FIG. 1, is that the current mirror-type load consisting of the FETs 24 and 26 is modeled as simply a static load, i.e., a resistance related to the conductance and transconductance of the FETs 24 and 26. The current provided to the FETs 24 and 26 is limited by the current source FET 18. Therefore, when either of the FETs 20 or 22 requires more current in response to a change in gate voltage, i.e., an input voltage changes, the other FET is obliged to source less current to its corresponding load FET. It is desirable to provide a differential amplifier circuit with an active load stage, whereby the small signal gain of the amplifier is increased resulting in increased speed for applications such as a voltage comparator circuit.

Referring now to FIG. 4, there is depicted a low voltage comparator circuit, including a differential amplifier circuit 52 according to the present invention. While the differential amplifier circuit 52 will be described with reference to the embodiment illustrated in FIG. 4, no limitation of the scope of the invention is thereby intended.

The low voltage comparator circuit 50 further includes a double-ended to single-ended conversion stage 48 comprising two input N-channel FETs 54 and 56 and two P-channel FETs 58 and 60 forming a current mirror-type load circuit. The input FETs 54 and 56 are controlled at their gates by voltages from outputs E and F of the circuit 52, respectively. A single output terminal G of the stage 48 is applied to the inverting amplifier 62 at the gates of a P-channel FET 64 and an N-channel FET 66 having their drains connected at an output terminal H. Functions performed by the double-ended to single-ended conversion stage 48 and the inverting amplifier 62 include shifting the voltage level at the terminal F to that appearing at the output terminal H, and providing a buffer amplifier stage for increased gain and load capabilities so that the balance established at the output terminals E and F of the differential amplifier circuit 52 is maintained at the single-ended output terminal H.

The differential amplifier circuit 52, illustrated within a box in FIG. 4, will now be specifically described as to its structure and operation. The circuit 52 includes two differential input P-channel FETs 68 and 70 and two load N-channel FETs 72 and 74. The input FET 68 and the load FET 72 are series-connected, drain to drain, across the supply voltage terminals 44 and 46 to define a first current path. Likewise, the input FET 70 and the load FET 74 are series-connected to define a second current path. Input voltage signals are applied to the gates of the input FETs 68 and 70 at the input terminals A and B, respectively. The output terminals E and F are taken off at the junction between FETs 68 and 72, and FETs 70 and 74, respectively.

The input voltage signal applied to the terminal A is amplified by an inverting amplifier 76 comprising a P-channel FET 78 and an N-channel FET 80 before being applied to the gate of the load FET 74. In like fashion, the input signal applied to the terminal B is amplified by an inverting amplifier 82 comprising a P-channel FET 84 and an N-channel FET 86 before being applied to the gate of the load FET 72. Consequently, opposite gate signals, i.e., voltages that move toward opposite supply voltage terminals 44 and 46, are applied to the gates of the FETs 68 and 74 and the FETs 70 and 76, respectively.

For purposes of illustration, but without any limitation of the invention, the inverting amplifiers 76 and 82 each comprise a P-channel FET and an N-channel FET connected in series, drain to drain, across the voltage supply terminals 44 and 46. The FETs 80 and 86 each have their drain and gate tied together, thus acting as a resistive load. The output terminals I and J of the inverting amplifiers 82 and 76 are taken from the drains of the FETs 86 and 80, respectively. As previously described, the outputs I and J are connected to the gates of load FETs 72 and 74, respectively.

During operation of the voltage comparator circuit 50 of FIG. 4, the voltage at the output terminal H is approximately one-half the supply voltage across the terminals 44 and 46 when the voltages at the input terminals A and B are equal. As the voltage at the input terminal A becomes greater than the voltage at the input terminal B, the voltage at the output terminal H approaches the upper supply voltage at the terminal 44. Similarly, when the voltage at the input terminal A becomes less than the voltage at the input terminal B, the voltage at the output terminal H approaches the lower supply voltage at the terminal 46.

Describing the operation of the differential amplifier 52 in further detail, the FETs of the circuit 52 are sized so that all are operating in the saturation region when voltages applied to the input terminals A and B are equal. If FET pairs 68 and 70, 72 and 74, 84 and 78, and 86 and 80 are substantially identical, the output voltages at the terminals E and F will be equal as well. However, it will be appreciated that hysteresis may be introduced by appropriate circuit design techniques without departing from the principles of the present invention.

When the voltage at the input terminal A increases, assuming the voltage at the input terminal B remains the same, the following circuit operation is observed. Increased voltage at the gate of the FET 68 immediately decreases the gate-source voltage ($V_{gs}$) of the FET 68 and consequently, the drain-source current ($I_{ds}$) through the FET 68 and the first current path defined by FETs 68 and 72 decreases. A drop in the $I_{ds}$ of the FET 72 results in a sharp drop in the drain-source voltage ($V_{ds}$) across the FET 72 due to the $I_{ds}$ versus $V_{ds}$ characteristic curve of the FET. As the voltage at the terminal E, i.e., the $V_{ds}$ of the FET 72 decreases, the $V_{ds}$ of the FET 68 increases, thus causing the $I_{ds}$ to rise slightly and eventually establish a new, lower stable operating point at the terminal E.

The input voltage at the terminal A is also applied to the gate of the FET 78. If the voltage at the input terminal A increases and the voltage at the terminal B remains the same, as previously assumed, the $I_{ds}$ of the FET 78 decreases. The decrease in $I_{ds}$ of FET 78 results in a sharp drop in the $V_{ds}$ across the FET 80, which is herein modeled as a resistor the value of which depends on the conductance and transconductance of the FET 80.

The decrease in $V_{ds}$ across the FET 80, i.e., the voltage at the terminal J, results in a decreased $V_{gs}$ for the FET 74. With decreased $V_{gs}$, the FET 74 sinks less current. The response of the FET 70 to a demand for less current, where the voltage at the input B remains the same, is a sharp decrease in the $V_{ds}$, once again due to the $I_{ds}$ versus $V_{ds}$ characteristic curve. The sharp decrease in $V_{ds}$ across the FET 70 causes an increase in the voltage at the output terminal F and an attendant increase in the $V_{ds}$ of the FET 74. The increase in the $V_{ds}$ of the FET 74 causes $I_{ds}$ to decrease slightly and to eventually establish a new, higher operating point at the terminal F.

As can be seen from the foregoing description, an increase in the voltage at the input terminal A results in a seesaw effect at the terminals E and F, wherein the voltage at the terminal E decreases and the voltage at the terminal F increases.

The differential amplifier circuit 52 of FIG. 4 is totally symmetric and, therefore, the foregoing description of the operation of the circuit 52 in response to a change in voltage at the input terminal A is equally applicable to the response of the circuit 52 to a change in voltage at the input terminal B, or to changes in voltage at both terminals.

A primary advantage of the differential amplifier circuit 52 of the present invention is the capability of low voltage operation. With no more than two FETs connected in series between the supply voltage terminals 44 and 46, the supply voltage at the terminal 44 can be lowered to approximately two threshold levels above the supply voltage at the terminal 46. In automotive applications wherein an integrated circuit process produces a 800 millivolt nominal threshold voltage, for example, the supply voltage across the terminals 44 and 46 can decrease to approximately three volts. The common mode input range is essentially a threshold voltage less than the supply voltage.

Another advantage of the circuit 52 is that with the sources of the P-channel FETs connected directly to the upper supply voltage terminal 44, the effect of the MOSFET body voltage upon the threshold voltage is minimal, i.e., the threshold voltage is not increased as in the prior art circuit of FIG. 1.

Yet another significant aspect of the present invention, as previously stated, is the increased speed of the comparator circuit 50 due to the increased gain of the differential amplifier circuit 52. Specifically, the transconductances of the FETs 84 and 78 increase the overall gain of the circuit 52.

A further advantage of the circuit 52 is the ability to decrease the quiescent power by driving either of or both the input terminals A and B toward the upper supply voltage at the terminal 44. This causes the FETs 68, 70, 78 and 84 to cut off and pass essentially no current.

It should be appreciated that when the differential amplifier circuit 52 is fabricated in a semiconductor integrated circuit of a complementary MOS (CMOS) structure employing both N-channel transistors and P-channel transistors, the total symmetry of the circuit provides advantages in dealing with processing variations with a minimum number of circuit elements. For instance, offset voltages are decreased and tend to be more predictable.

It will be appreciated that the foregoing description of a preferred embodiment of the invention is presented by way of illustration only (and not by way of any limitation) and that various alternatives and modifications may be made to the illustrated embodiment without departing from the spirit and scope of the invention.

The embodiments of the invention in which an exclusive property or privilege is claimed are defined as follows:

1. A low voltage differential amplifier circuit, powered by a supply voltage, for amplifying the voltage difference between a first input voltage signal and a second input voltage signal to produce a differential output voltage representing the difference between a first output voltage signal and a second output voltage signal, comprising:

first and second voltage controlled current sources, the current supplied by the first current source being controlled directly by the first input voltage signal and the current supplied by the second current source being controlled directly by the second input voltage signal;

first and second voltage controlled current loads, the first current load being connected in series with the first current source to form a first current path and the second current load being connected in series with the second current source to form a second current path, the first current load being controlled directly by the second input voltage signal and the second current load being controlled directly by the first input voltage signal, the first current path and the second current path being connected in parallel across the supply voltage to form substantially identical current paths, and the voltage potential at the junctions between the first and second current sources and the first and second current loads defining the respective first and second output voltage signals.

* * * * *